US006869509B2

United States Patent
Gstoehl et al.

(10) Patent No.: US 6,869,509 B2
(45) Date of Patent: Mar. 22, 2005

(54) SOURCE FOR VACUUM TREATMENT PROCESS

(75) Inventors: Oliver Gstoehl, Balzers (LI); Mauro Pedrazzini, Vaduz (LI)

(73) Assignee: Unaxis Balzers Limited, Balzers (LI)

( * ) Notice: Subject to any disclaimer, the term of this patent is extended or adjusted under 35 U.S.C. 154(b) by 0 days.

(21) Appl. No.: 10/293,643

(22) Filed: Nov. 13, 2002

(65) Prior Publication Data

US 2003/0094362 A1 May 22, 2003

(30) Foreign Application Priority Data

Nov. 20, 2001 (CH) .............................................. 2130/01

(51) Int. Cl.[7] .............................................. C23C 14/35
(52) U.S. Cl. ........................ 204/192.38; 204/298.41; 204/298.17; 204/298.14; 204/298.09
(58) Field of Search ........................ 204/298.41, 298.17, 204/298.2, 298.08, 298.09, 298.14, 192.38, 192.12

(56) References Cited

U.S. PATENT DOCUMENTS

| 5,298,136 | A | * | 3/1994 | Ramalingam | 204/192.38 |
| 5,317,235 | A | | 5/1994 | Treglio | 315/111.41 |
| 5,676,810 | A | * | 10/1997 | Schwendener | 204/298.09 |
| 5,843,293 | A | * | 12/1998 | Murakami et al. | 204/298.41 |
| 6,103,074 | A | | 8/2000 | Khominich | 204/192.38 |

FOREIGN PATENT DOCUMENTS

| JP | 01240645 | | 9/1989 | ............ C23C/14/24 |
| JP | 2000-340165 | * | 12/2000 | ............ H01J/37/317 |

* cited by examiner

Primary Examiner—Steven VerSteeg
(74) Attorney, Agent, or Firm—Notaro & Michalos P.C.

(57) ABSTRACT

The invention relates to an arc source or a source for vaporizing or sputtering of materials and a method for operating a source. The source comprises an insulated counter-electrode and/or an AC magnet system. Thereby, dependent on the requirement, any desired potential can be applied to the counter-electrode and/or the source can be operated with different magnet systems, in particular as arc or sputter source.

24 Claims, 2 Drawing Sheets

SOURCE FOR VACUUM TREATMENT PROCESS

FIELD AND BACKGROUND OF THE INVENTION

The present invention relates to a source for a vacuum treatment process, in particular an arc or a combined arc and sputter source as well as a method for operating a source.

Arc sources as well as arc and sputter sources are applied in vacuum coating installations in various ways, with each source comprising different advantages according to the physical processes and the particular special technical implementations on which it is based.

In the following by arc source is understood a source in which on the surface of a target a light arc—also referred to in the literature as arc or spark—is ignited. Arc sources are especially suitable for processes in which high ionization of the metal vapor is of advantage. As an example is here listed the so-called ion plating method for the deposition of layers having especially high adhesiveness or the metal ion etching for the pretreatment and cleaning of surfaces.

By sputter source is understood in the following a source in which, with the aid of a plasma, material is sputtered off a target by ion bombardment. If, beyond that, with the aid of a suitably laid-out magnet system the plasma is concentrated substantially in the form of a closed ring in the proximity of the target, this is referred to as a magnetron sputter source.

For example sputter sources are highly suitable for the deposition of smooth layers, in particular if materials are to be transformed into the gas phase whose individual components have very different vapor pressures.

Within prior art a multiplicity of formations and special adaptations of highly diverse arc or sputter sources are known, which were developed to do justice to the broad requirement spectrum in different application fields.

For example German reference DE 19702928 C2 discloses an arc source, in which a magnet stabilizing the light arc is disposed in a cathode housing, which is sealed against the vacuum chamber and perpendicularly displaceable, and, in turn, is itself movable perpendicularly to the target surface.

Of disadvantage is therein the providing of vacuum sealing faces on parts moved against one another, which possibly are additionally subjected to strong temperature fluctuations through the operation of the arc source.

European reference EP 0459137 B1 discloses an arc and sputter source, in which a center-pole permanent magnet is disposed in fixed position on the back side of the target, while margin permanent magnets are supported axially displaceable relative to the target and center pole magnet. Thereby in a target-proximate position of the margin permanent magnets the operation as a sputter source is made possible, in a margin-distant position the operation as an arc source, in particular for pretreatment and cleaning by means of metal ion etching.

Based on the relatively complicated structure with axially displaceable magnet configurations, conventionally moved by electromotors, industrial implementations of such sources are in general large, structurally high and expensive of production.

European reference EP 0495447 B1 describes the principle of an arc source with which alloys of materials with very different vapor pressure can also be transformed into the gas phase without excessive spatter formation. However, with sources structured in this way, for example good target utilization cannot readily be attained or defined multilayer layers be deposited.

SUMMARY OF THE INVENTION

It is therefore the objective of the present invention to eliminate the disadvantages of prior art. The objective in particular is to provide an arc source by applying the characteristics according to the invention, which sources make possible better settings of the operating parameters and thus a better layer quality.

A further objective is providing a universal source which, in comparison to known sources, is of simpler structure, has increased economy and permits free selection of the operating modes 'sputtering' and 'arcing'.

According to the invention the objectives are attained through the characteristics set out in the claims.

Such a source for vaporizing or sputtering materials comprises a housing fastened in a cutout of a vacuum chamber or in which the individual parts of the source are disposed. As is known on the front side of the housing, i.e. in the direction of the material stream of the source, is disposed a target of any form as well as at least one counter-electrode. For the purpose of cost-efficient production of the targets or other components of the source, a substantially round or rectangular shape of the target is conventionally preferred. The target itself can be switched as cathode to the negative pole of a current/voltage supply. Depending on the application of the source as arc or sputter source, a known high-current or high-voltage supply or a supply switchable for both operating modes can be employed. If the source is to be operated as arc source, at least one device is to be provided for igniting the light arc.

In a preferred embodiment according to the invention the counter-electrode or the electrode and at least a portion of the housing or also the entire housing is therein electrically insulated relative to the vacuum chamber and the target or the parts which are at ground or target potential. Consequently, the counter-electrode and optionally portions of the housing can be free floating or placed at another freely selectable potential and thus an additional control parameter can be introduced for setting the arc or sputter process.

Compared to conventional sources, in which by grounding the counter-electrode virtually the entire surface of the vacuum chamber is switched as anode, in the present invention commonly a stronger electron bombardment of the anode occurs, whereby the latter is heated to a greater degree. To that end the counter-electrode can be adapted through simple constructional measures, such as the additional provision of a cooling mechanism, an enlargement of the surface or the appropriate material selection. If the counter-electrode is to be cooled additionally, this can be attained in conventional manner by providing cooling channels or by applying cooling coils in the rearward portion of the counter-electrode and similar means. Advantageously the cathode as well as also the counter-electrode are therein cooled through a common water circulation electrically isolated through water resistances.

Especially for employment as an arc source, it has been found to be advantageous if the current feeding is carried out in the rearward central proximity of the target, preferably via a cooling plate connected vacuum-tight with the housing. In comparison to sources with laterally disposed current feeds, not only a symmetric but also better utilization of the target could be attained by means of superposition of the magnetic field generated by the centrally entering target current with the fields of the further magnet system(s).

A further advantage was therein the variety of such a source in the combination of different method steps. For example, the counter-electrode can be switched in a preceding etching step as the anode of a low-voltage arc discharge. For this purpose in a manner known per se a low-voltage arc is ignited between one or several helical windings, preferably disposed in an ionization chamber separated by a mask, and one or several anodes, in this case counter-electrodes, and ions are extracted from the workpieces to be cleaned connected to negative potential. After completion of the etching step the coating process is started by switching into arc or sputter operation. The best coating results in an industrial coating installation with multiply rotating workpiece holders are attained with a disposition, central with respect to these, of the light arc or the source, wherein the counter-electrode is initially switched as anode of the low-voltage arc discharge and subsequently from the target a material for an adhesion layer is vaporized. The material(s) for the structure of the function layer or layers, were subsequently vaporized or sputtered by peripheral sources disposed on the side walls of the coating installation with the addition of the particular required reactive gases.

In a further preferred embodiment of the invention, in a source known per se at least one magnet system is formed as an interchangeable magnet system. Therewith the magnet system can be matched to the geometric dimensions of the housing and/or the outer circumference of the current supply such that it is freely movable at least in one direction. Additionally guidances for introducing and removing or for adjusting the magnet system can be provided. In order to make possible an especially simple manipulation, on the backside of the interchangeable magnet systems gripping aids such as handles, depressions, buttons and the like can be provided. Advantageously, additionally the current supply is provided with a first quick-connect and the interchangeable magnet system with a second quick-connect, with both quick-connects preferably being implemented as plug connections. On the second quick-connect means can be provided which make possible detecting the type of magnet system and, if required, a current supply for the feed and control of an electromagnet system or one or several driving motors for moving at least one magnet system. For example, as is known, therewith a magnet system can be moved on the backside of the target or the cooling plate in order to guide the at least one arc or sputter discharge into a predetermined path.

Therewith for the first time the capability is given of optimally matching the source to completely different process requirements by simple rapid exchange of the AC magnet system. For example, the often advantageous matching of the magnet system to different target materials or the alternative application of the same source as an arc or sputter source, in particular preferred as a magnetron sputter source, may be cited, wherein the exchange, if required, can take place without interruption of the vacuum during a heating/cleaning/coating cycle. For example by detecting the magnet system via the process control the automatic switching from arc over to sputter operation can be completed. While, for example, for the arc vaporization a relatively week, magnetic flux density, also generatable with one or several electric coils at or over the surface of the target, is sufficient, for sputtering of many materials high flux densities must be provided, which are advantageously built up with permanent magnets. In order to optimize the target yields, magnetic fields can be shifted or changed with respect to the surface. This can be carried out in known manner through the electric control of different coils forming a magnet system or through the mechanical movement of the magnet system.

In a further preferred embodiment, on a source provided with an electrically insulated counter-electrode as described above and, optionally, with interchangeable magnet system, additionally a switch is disposed for switching over the operating modes of the target and of the counter-electrode. Simultaneously, therein one or several devices are provided for igniting a light arc, as well as means in order to restrict the region of operation of one or several light arcs to the front side of the counter-electrode.

Thereby by means of cathodic light arc discharge material of the counter-electrode can also be transformed into the gas phase. A source implemented in this way can be applied especially advantageously if the counter-electrode is fabricated of an adhesion layer material, such as for example titanium or chromium, which, additionally, can be well vaporized with low spattering. As means for igniting a light arc as well as also for igniting on the target is suitable for example a known ignition finger or at least one bridge connecting the counter-electrode or the housing and the target, comprised of a nonconducting, preferably ceramic base material, with a nanometer or a few micron thin covering layer deposited thereon, which connects the counter-electrode or the housing and the target such that it is electrically conducting. The thin conducting cover layer is vaporized by application of the arc supply on the target or the counter-electrode and thereby ignites the light arc. If the connecting bridge is applied such that during the treatment process a recoating takes place, light arcs can be ignited in rapid succession alternatively on cathode or counter-electrode. A further option for igniting light arcs can be employed inter alia by applying an ignition finger supported rotationally and pivotably, which advantageously after the ignition is swivelled to target or countercathode from the source/substrate aspect connection.

As means for restricting or guiding the light arc are suitable for example known measures, such as the application of an additional magnetic field, the disposition of a limiter ring substantially encompassing the counter-electrode on the outside, insulated coverages in the rearward or lateral region of the counter-electrode or of the housing taking into consideration the dark space, or a combination of different measures.

With one or several sources according to the invention described by example but not in all embodiment variants, a number of vacuum treatment methods can be carried out with a lower expenditure than previously or with especially favorable layer properties.

For example, a source according to the invention with interchangeable magnet system in any desired alternating sequence can be operated as an arc source and, after replacing the magnet system, if required without interruption of the vacuum, with another magnet system, in particular a magnetron magnet system, as a sputter source, if simultaneously one or several, preferably switchable, current/voltage supplies suitable for the particular process, are provided.

With a source according to the invention with insulated counter-electrode, for example for the first time a method can be carried out in which with only one source two different materials can be vaporized or sputtered in any desired time sequence. For this purpose, for example after applying a substrate voltage customary for coatings of approximately 10–300 V, preferably between 40 and 200 V, an adhesion layer can be deposited by arc vaporization from the counter-electrode onto the workpieces. As a consequence, after extinguishing the light arc discharge on the counter-electrode by switching over the sources or supply poles and igniting a light arc on the cathode a second material can be vaporized.

If, based on its tendency toward spatter formation during the arc process, the second material is better suitable for sputtering from a sputter target and if, at the source, also at least one magnet system for operation as sputter source is provided, then in addition to the exchange of the polarity, switching to a high-voltage source can take place and material can be sputtered off the target. Therein preferably the change of the operating mode takes place by switching over a single current/voltage supply laid out for this purpose.

In addition, a step preceding the coating for cleaning the workpiece through so-called metal ion etching can also be carried out, for which on the target or the counter-electrode a light arc is ignited and the workpiece is placed at a high negative potential, preferably greater than 800 V.

Application as an arc and sputter source can also be meaningful if the same counter-electrodes or the same target materials is utilized. For example, after the metal ion etching a sputter process can follow directly or the different properties of arc and sputter layers in two- or multilayer systems can be utilized.

In addition, such a source can also be deposited in many other process sequences, for example combined with other or additional etching and heating steps, or for the production of multilayer layers, but in particular for the production of hard and slide layers or a combination of these layers in particular in combination with an adhesion layer.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

The invention will now be explained by example in conjunction with schematic drawings in which.

DESCRIPTION OF THE PREFERRED EMBODIMENTS

Figure 1:
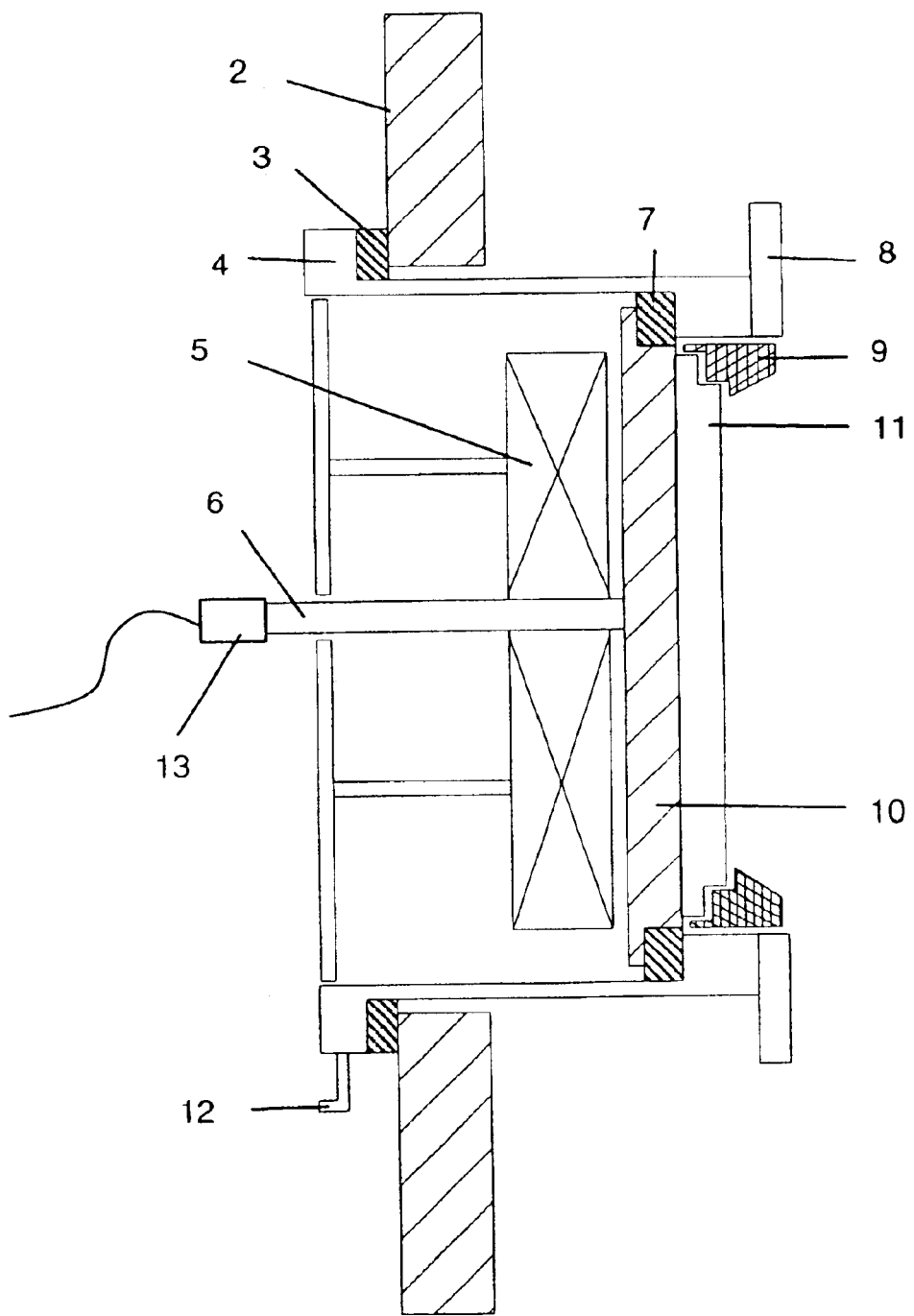
FIG. 1 is a diagram of an arc and/or sputter source.

FIG. 1 shows a preferred source according to the invention with electrically insulated counter-electrode and interchangeable magnet system for arc vaporization or sputtering of a target.

A housing 4 of a source 1 is fastened via an electric insulator 3, comprised of a heat-resistant synthetic material or similar material, on the vacuum chamber 2. Additionally, in the case of the positioning of insulator 3 shown in FIG. 1 sealing elements, not further shown here, are disposed in order to ensure the vacuum-tight fastening of the source. Instead of the entire housing 4, alternatively also only a portion of housing 4 or only the counter-electrode 8 can be electrically insulated from the vacuum chamber 2 or the housing 4, whereby the additional sealing function of the insulator can be omitted.

Counter-electrode 8 or housing 4 are isolated by a further, preferably ceramic insulator 7 from the cooling plate 10. This insulator 7 is also provided with vacuum sealing elements not further shown. The interchangeable magnet system 5 located behind the cooling plate 10 under atmospheric pressure is consequently readily accessible and, after unplugging the plug connection 13 and a further quick-connect here not further shown and to be applied, if required, on the interchangeable magnet system 5, can be readily pulled in the rearward direction and exchanged.

On the front side of cooling plate 10 is disposed the target 11, between target 11 and counter-electrode 8 a limiter ring 9 is positioned, which, on the one hand, is electrically insulated from the target 11 as well as also from the counter-electrode 8, but which itself is a good conductor. In a further embodiment the limiter ring itself can be comprised of a material with a secondary electron emission rate which, in comparison to the target, is lower and a lower surface energy such as for example of BN or TiN.

Figure 2:
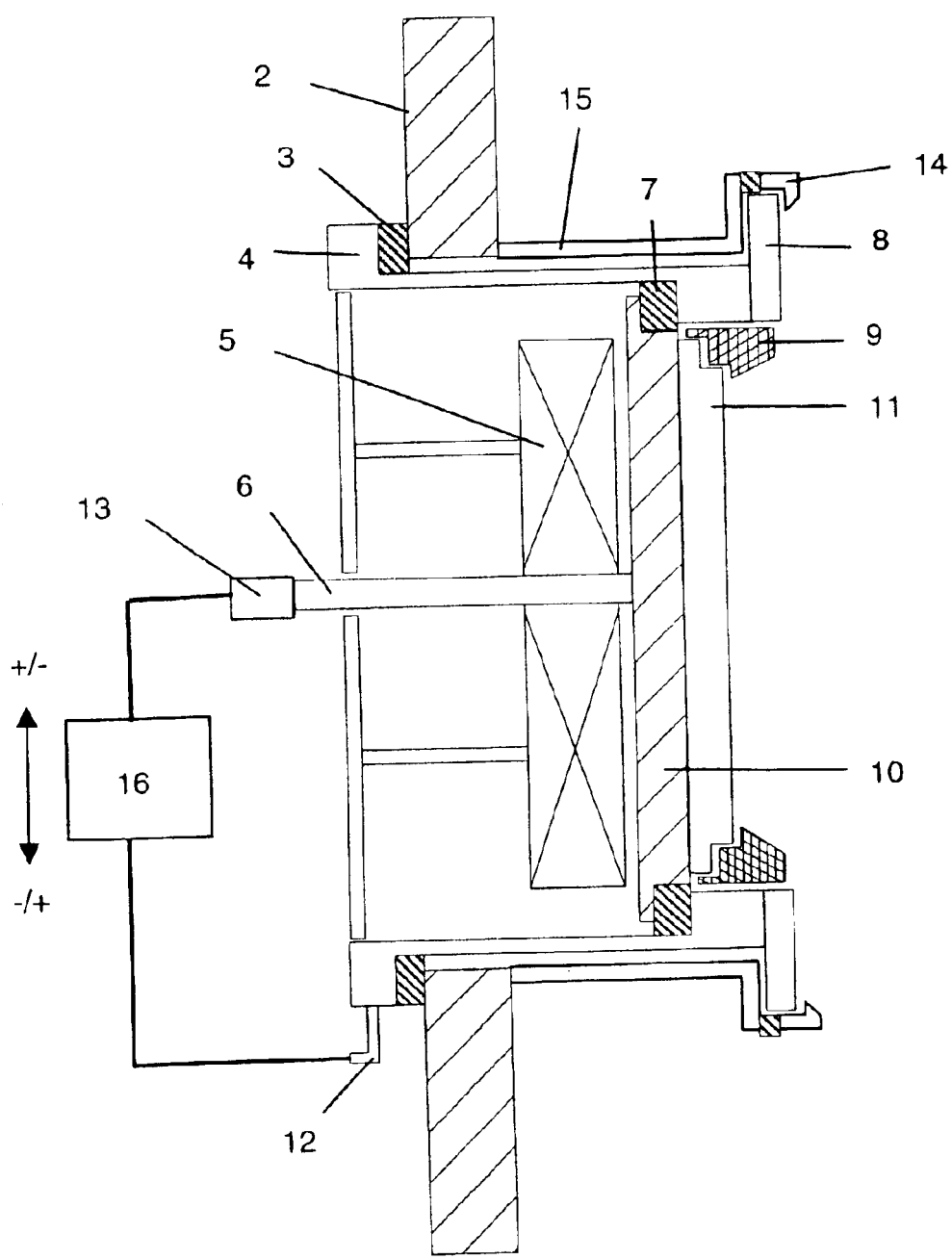
FIG. 2 is a diagram of a source with switchable operating modality.

FIG. 2 shows a further preferred source with switchable operating mode and one (of several possible) switchable current/voltage supply 16 as well as an additional limiter ring 14, which advantageously is fastened with electrical insulation on a cover 15. The latter can be disposed either on the vacuum chamber 2 or itself again electrically insulated, on housing 4 of the source 1 and, together with it, be disposed detachably from the vacuum chamber 2. A further advantageous embodiment of such a source is to carry the current supply 12 electrically insulated up to the immediate proximity to the counter-electrode 8 and to dispose the insulation between counter-electrode 8 and housing 4 otherwise disposed between vacuum chamber 2 and housing 4.

Furthermore, in the rearward proximity of the counter-electrode 8 additional magnets, not shown here, or electromagnets for guiding the light arc can be provided.

A source such as described in FIG. 2 is especially well suited for transforming materials from target 11 as well as from counter-electrode 8 into the gas phase.

Examples of the operation of a source according to the invention:

Preferred operating parameters and limit values for the operation of a circular target as arc source are compiled in Table 1 (target diameter approximately 160 mm, d=6–12 mm, target material: Ti).

TABLE 1

| Parameters | Unit | Preferred Range | Lower, Upper Limit |
|---|---|---|---|
| Pressure | mbar | $10^{-4}$–$4 \times 10^{-1}$ | $10^{-4}$–$10^{-1}$ |
| Arc current | A | 80–250 | 40–250 |
| Arc voltage | V | 20–55 | 10–100 |
| Vaporization rate | g/min | appr. 0.3 | to appr. 0.7 |
| Substrate distance | mm | 200–300 | 100–550 |
| Coating diameter* | mm | 200 | 220 |
| Magnetic flux density | Gauss | 55 | 0–200 |

*Coating diameter with layer thickness distribution ±15% at 200 mm substrate distance.

Preferred operating parameters and limit values for the operation of a circular target as sputter source are compiled in Table 2 (target diameter approximately 160 mm, d=6–12 mm, target material: Ti):

TABLE 2

| Parameters | Unit | Preferred Range | Lower, Upper Limit |
|---|---|---|---|
| Pressure | mbar | $5 \times 10^{-3}$–$2 \times 10^{-2}$ | $3 \times 10^{-3}$–$10^{-1}$ |
| Sputter power | kW | 1–4 | 0.5 to 10 |
| Sputter voltage | V | 100–900 | 50–1000 |
| Sputter rate | g/min | appr. 0.2 | to appr. 0.5 |
| Substrate distance | mm | 200–300 | 100–550 |
| Coating diameter* | mm | 200 | 220 |
| Magnetic flux density | Gauss | 250–350 | 200–500 |

*Coating diameter with layer thickness distribution ±15% at 200 mm substrate distance.

LIST OF REFERENCE NUMBERS

1 Source
2 Vacuum chamber
3 Housing insulator
4 Housing
5 Magnet system
6 Current supply counter-electrode
7 Target insulator
8 Counter-electrode
9 Limiter ring
10 Cooling plate
11 Target
12 Current supply target
13 Quick-connect
14 Limiter ring
15 Covering
16 Current/voltage supply While specific embodiments of the invention have been shown and described in detail to illustrate the application of the principles of the invention, it will be understood that the invention may be embodied otherwise without departing from such principles.

What is claimed is:

1. An arc source for vaporizing materials in a vacuum chamber, comprising: a target (11) switched as a cathode, a current supply (6) for powering the arc source, at least one counter-electrode (8) at least substantially laterally encompassing the target (11), a housing (4) on which or in which individual parts of the arc source (1) are disposed, a cooling plate (10) connected in a vacuum-tight manner to the housing (4) and a magnet system (5) disposed on the backside of the cooling plate (10) or on the backside of the cooling plate (10) and at a distance that is adjustable with respect to the target (11), the counter-electrode (8) or the counter-electrode (8) and at least a portion of housing (4), being electrically insulated relative to the vacuum chamber an the target (11).

2. A source as claimed in claim 1, including means for vaporization or sputtering of materials in the vacuum chamber, at least one magnet system (5) comprising an interchangeable magnet system and matched to geometric dimensions of the housing (4) and the current supply (6) such that the magnet system is freely movable in at least one direction.

3. A source as claimed in claim 1, wherein the current supply (6) is disposed in a backside central region of the target (11).

4. A source as claimed in claim 1, including an electrically insulated limiter ring (9) substantially disposed between the target (11) and the counter-electrode (8), and substantially encompasses the target (11).

5. A source as claimed in claim 1, wherein the current supply (6) takes place centrally via the cooling plate (10).

6. A source as claimed in claim 1, wherein the magnet system (5) is a selected interchangeable magnet system, and wherein the current supply (6) is provided with a first quick-connect (13) and the interchangeable magnet system with a second quick-connect.

7. A source as claimed in claim 6, wherein the second quick-connect comprises means to detect a selected interchangeable magnet system (5).

8. A source as claimed in claim 1, including at least one interchangeable magnet system of different field strengths, the at least one interchangeable magnet system comprising one or several electric coils and at least one interchangeable magnet system permanent magnet.

9. A source as claimed in claim 1, wherein the at least one counter-electrode (8) or the counter-electrode (8) and at least a portion of the housing (4) is switched as an anode.

10. A source as claimed in claim 1, including a switch for switching over an operating mode of the target (11) and the counter-electrode (8), one or several devices for igniting a light arc, and means for restricting a region of operation of one or several light arcs onto a front side of the counter-electrode (8).

11. A source as claimed in claim 10, wherein the counter-electrode (8) is comprised of an adhesion layer material.

12. A source as claimed in claim 10, wherein the counter-electrode (8) is comprised of an adhesion layer material formed by one of Cr or Ti.

13. A source as claimed in claim 1, including means for igniting a light arc in the chamber comprising an ignition finger supported rotatably and pivotably or at least one bridge connecting the counter-electrode (8) or the housing (4) and the target (11) and comprised of a nonconducting base material, with a thin cover layer deposited thereon, which electrically conductingly connects the counter-electrode (8) or the housing (4) and the target (11).

14. A source as claimed in claim 13, wherein the nonconducting base material is a ceramic.

15. A method for operating a combined arc and sputter source, comprising, in any alternating sequence, the steps of: igniting a light arc on a counter-electrode (8) switched as a cathode to vaporize material; switching one target (11) as a anode and subsequently, after extinguishing the light arc discharge on the counter-electrode (8) and switching over of an operating mode, material is sputtered from the target (11) with the counter-electrode being switched as an anode.

16. A method as claimed claim 15, including applying a hard or slide layer or a combination of said layers onto a workpiece.

17. A method as claimed in claim 16, depositing one or several adhesion layers between a substrate and the hard layer or between hard layer and slide layer.

18. A method for operating an arc or a combined arc and sputter source, comprising, in that in any alternating sequence, the steps of: igniting a light arc on a counter-electrode (8) that is switched as an anode to vaporize material; switching one target (11) as an anode; and subsequently, after extinguishing the light arc discharge on the counter-electrode (8) and switching over an operating mode, igniting a light arc on the target (11) with material being vaporized from the target, with the counter-electrode (8) being switched as an anode.

19. A method as claimed claim 18, including applying a hard or slide layer or a combination of said layers onto a workpiece.

20. A method as claimed in claim 19, depositing one or several adhesion layers between a substrate and the hard layer or between hard layer and slide layer.

21. A method for operating a source (1), comprising, in any alternating sequence, the steps of: operating a source (1) with a magnet system (5) as a arc or sputter source; and, after changing the magnet system (5) without interruption of a vacuum; operating with another magnet system as a arc or sputter source.

22. A method as claimed in claim 21, for operating an arc or a combined arc and sputter source, comprising alternately operating a counter-electrode (8) as an anode of a low-voltage arc discharge and as an anode of an arc discharge.

23. A method as claimed claim 21, including applying a hard or slide layer or a combination of said layers onto a workpiece.

24. A method as claimed in claim 23, depositing one or several adhesion layers between a substrate and the hard layer or between hard layer and slide layer.

* * * * *

UNITED STATES PATENT AND TRADEMARK OFFICE
CERTIFICATE OF CORRECTION

PATENT NO. : 6,869,509 B2
DATED : March 22, 2005
INVENTOR(S) : Gstoehl et al.

It is certified that error appears in the above-identified patent and that said Letters Patent is hereby corrected as shown below:

Column 8,
Line 7, change "a selected" to -- the selected --;
Line 49, before "depositing" insert -- including --;
Line 51, insert -- the -- before "hard layer" and before "slide layer";
Line 53, the words "in that" should be deleted;
Line 65, insert -- including -- before "depositing";
Line 67, insert -- the -- before "hard layer" and before "slide layer";

Column 9,
Lines 3 and 5, change "a arc" to -- an arc --;
Line 9, change "a counter-electrode" to -- the counter-electrode --;

Column 10,
Line 4, insert -- including -- before "depositing"; and
Line 6, insert -- the -- before "hard layer" and "slide layer".

Signed and Sealed this

Twelfth Day of July, 2005

JON W. DUDAS
*Director of the United States Patent and Trademark Office*